(12) United States Patent
Jiang

(10) Patent No.: US 7,880,557 B2
(45) Date of Patent: Feb. 1, 2011

(54) HYBRID MARCHAND/BACK-WAVE BALUN AND DOUBLE BALANCED MIXER USING SAME

(75) Inventor: Xin Jiang, Chelmsford, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 74 days.

(21) Appl. No.: 12/381,465

(22) Filed: Mar. 12, 2009

(65) Prior Publication Data

US 2010/0231316 A1 Sep. 16, 2010

(51) Int. Cl.
*H03H 7/42* (2006.01)
*H01P 3/08* (2006.01)
(52) U.S. Cl. .......................... 333/26; 333/116
(58) Field of Classification Search .......... 333/109, 333/110, 111, 112, 115, 116, 25, 26
See application file for complete search history.

(56) References Cited

U.S. PATENT DOCUMENTS

| | | | |
|---|---|---|---|
| 5,061,910 A | 10/1991 | Bouny | |
| 5,886,589 A * | 3/1999 | Mourant | 333/26 |
| 6,275,689 B1 | 8/2001 | Gill | |
| 6,292,070 B1 | 9/2001 | Merrill | |
| 6,483,415 B1 * | 11/2002 | Tang | 336/200 |
| 6,683,510 B1 | 1/2004 | Padilla | |
| 6,819,199 B2 | 11/2004 | Burns et al. | |
| 7,068,122 B2 * | 6/2006 | Weng et al. | 333/26 |
| 7,250,828 B2 * | 7/2007 | Erb | 333/26 |
| 7,528,676 B2 * | 5/2009 | Kearns et al. | 333/26 |
| 2008/0045162 A1 | 2/2008 | Rofougaran et al. | |
| 2008/0150688 A1 | 6/2008 | Burr | |
| 2008/0258838 A1 | 10/2008 | Oshima | |
| 2009/0015465 A1 | 1/2009 | Kanaya | |

OTHER PUBLICATIONS

Written Opinion from the International Searching Authority for International Application No. PCT/US2010/000759, dated May 17, 2010, 7 pages (unnumbered).
Chen et al., Novel Broadband Planar Balun Using Multiple Coupled Lines, IEEE, Microwave Symposium Digest, 2006, IEEE MTT-S International, pp. 1571-1574.
Trifunović, Review of Printed Marchand and Double Y Baluns: Characteristics and Application, IEEE Transactions on Microwave Theory and Techniques, Vo. 42, No. 8, Aug. 1994, pp. 1454-1462.
Lin et al. An Ultra-Broadband Doubly Balanced Monolithic Ring Mixer for Ku- to Ka-band Applications, IEEE Microwave and Wireless Components Letters, vol. 17, No. 10, Oct. 2007, pp. 733-735.
Gavela et al., A Small Size LTCC Balun for Wireless Applications, Proceedings of the $34^{th}$ European Microwave Conference 2004, pp. 373-376.
Marchand, Nathan, Transmission Line Conversion Transformers, Electronics vol. 17, Dec. 1944, pp. 142-145.

* cited by examiner

*Primary Examiner*—Dean O Takaoka
(74) *Attorney, Agent, or Firm*—Landiorio Teska & Coleman

(57) ABSTRACT

A hybrid Marchand/back-wave balun includes a first pair of coupled sections having a first primary section and first secondary section; a second pair of coupled sections having a second primary section and second secondary section; a first reactance interconnecting the first and second primary sections and a second reactance interconnecting the first and second secondary sections; one of the reactances being open at high frequency and shorted at low frequency, the other reactance being shorted at high frequency and open at low frequency for selectively providing low frequency Marchand/high frequency back-wave function and high frequency Marchand/low frequency back-wave function; and a double balanced mixer using same.

26 Claims, 15 Drawing Sheets

HYBRID MARCHAND/BACK-WAVE BALUN AND DOUBLE BALANCED MIXER USING SAME

FIELD OF THE INVENTION

This invention relates to a hybrid Marchand/back-wave balun and further to a double balanced mixer using such a hybrid balun.

BACKGROUND OF THE INVENTION

Single-ended-to-differential (or single-ended-to-balanced) signal converting circuits (baluns) have been widely employed in many radio frequency (RF), microwave and millimeter frequency applications. There have been many approaches and topologies proposed in previous works on the designs of baluns to meet various application demands. The Marchand balun, N. Marchand, "Transmission line conversion Transformers", Electronics, vol. 17, pp. 142-145, 1944, has become one of the most popular balun topologies to provide low-loss and wide-band differential signals. An alternative topology is described in U.S. Pat. No. 6,292,070; and is often referred to as a back-wave balun. Both topologies can be realized using either distributed elements or lumped elements. And in both balun approaches, the balun comprises a first and second pair of coupled transmission line sections for distributed topology or pair of coupled transformer sections for lumped-element topology. The distributed topologies usually offer better bandwidth performance than their corresponding lumped-element solutions but at the cost of large circuit area, which corresponds to higher manufacturing cost. There have been several publications: Gavela, "A small size LTCC balun for wireless applications", Proceedings of the European Microwave Conference 2004, pp 373-376;~U.S. Pat. No. 6,819,199, on the size reduction using lumped-element versions for the above two balun topologies.

Many forms of Baluns are known in the art. See: Gavela, "A small size LTCC balun for wireless applications", Proceedings of the European Microwave Conference 2004, pp 373-376; U.S. Pat. No. 6,819,199; Lin, "An Ultra-broadband Doubly Balanced Monolithic Ring Mixers for Ku- to Ka-band Applications", IEEE Microwave and wireless components letters, Vol. 17, No. 10, October, 2007; Trifimovic, "Review of Printed Marchand and Double Y Baluns: Characteristics and Application", EEE Transactions on Microwave Theory and Techniques, Vol. 42, No. 8, August, 1994;: Chen, "Novel Broadband Planar Balun Using Multiple Coupled Lines", Microwave Symposium Digest, 2006, IEEE MTT-S International, pp. 1571-1574, as well as U.S. Pat. No. 6,683,510 B1 to Padilla, U.S. Pat. No. 7,250,828 B2 to Erb, U.S. Pat. No. 7,068,122 B2 to Weng, U.S. Pat. No. 6,275,689 B1 to Gill and U.S. Pat. No. 5,061,910 to Bouny. All these references are incorporated by reference herein.

Marchand balun's differential output branches are connected to ground via the second pair of the coupled sections while the back-wave balun's differential outputs are not grounded at the second pair of the coupled section. Therefore, when DC groundings of the differential ports are needed, the Marchand balun approach is preferred, and when non-zero DC biasing is needed for the differential output port, the back-wave balun approach is preferred. In addition, because the fabrication limitations and parasitic effects limit their bandwidth performance, both balun topologies have their own optimum operation frequency bands. Choosing between Marchand and back-wave baluns based on trade-off in DC biasing and bandwidth performance is often made for each specific application and available fabrication process requirements. In addition, the distributed strip-line baluns with tight broadside coupling are often used to improve bandwidth. But those strip-line baluns require multiple metal layers with rigorously controlled three-dimension profiles, which impose greater fabrication difficulties and higher cost for most planar and semiconductor integrate circuit fabrication processes. Single ended-to-balanced circuits (baluns) are bi-directional in concept, i.e., the input can be single ended and be converted to a differential or balanced output or the input can be balanced or differential and the output single-ended.

SUMMARY OF THE INVENTION

In accordance with various aspects of the invention in at least one embodiment the invention presents a solution for baluns that provide multi-octave bandwidth and can be implemented with compact circuit size using most commonly available semiconductor and other planar fabrication processes. For certain applications, this invention could provide desired DC blocking and biasing features that are not achievable using only either a Marchand-type balun or a back-wave-type balun. The invention provides multi-octave bandwidth with balanced amplitude and phase for mixer and other applications, where single-ended-to-differential conversions are critical for overall circuit performance. In the mixer example presented here, a double balanced mixer using the proposed balun topologies demonstrates a 3-dB conversion-loss bandwidth of 24 GHz, covering 4.5~28.5 GHz. The invention is implementable using either distributed coupling lines or lumped elements. Both alternatives can be readily fabricated in most semiconductor and other planar fabrication processes. The lumped element approach will require the least real-estate and present the solution with the most compact circuit footprint for radio frequency and microwave frequency applications. In conventional Marchand baluns, the differential outputs are connected to ground via the grounded coupled lines, while in the back-wave baluns, the differential outputs are DC isolated from ground. Therefore, Marchand baluns are preferred for designs where DC grounding of differential output ports is needed and back-wave baluns are preferred for designs where DC-blocking of differential output ports is needed. In this invention, one could have the RF performance of a back-wave balun and enjoy the DC grounding feature of a Marchand balun, or achieve the RF performance of a Marchand balun and enjoy the DC blocking feature of a back-wave balun.

The invention results from the realization, in part, that an improved hybrid Marchand/back-wave balun, in various aspects can be achieved with a first pair of coupled sections having a first primary section and a first secondary section; a second pair of coupled sections having a second primary section and a second secondary section, and a first reactance interconnecting the first and second primary sections and a second reactance interconnecting the first and second secondary sections; thus one of the reactances is open at high frequency and shorted at low frequency, the other reactance is shorted at high frequency and open at low frequency for selectively providing low frequency Marchand/high frequency back-wave function and high frequency Marchand/low frequency back-wave function.

The subject invention, however, in other embodiments, need not achieve all these objectives and the claims hereof should not be limited to structures or methods capable of achieving these objectives.

This invention features a hybrid Marchand/back-wave balun including a first pair of coupled sections having a first primary section and first secondary section and a second pair of coupled sections having a second primary section and second secondary section. There is a first reactance interconnecting the first and second primary sections and a second reactance interconnecting the first and second secondary sections. One of the reactances is open at high frequency and shorted at low frequency, the other reactance is shorted at high frequency and open at low frequency for selectively providing low frequency Marchand/high frequency back-wave function and high frequency Marchand/low frequency back-wave function.

In a preferred embodiment the first reactance may be an inductive reactance the second reactance a capacitive reactance and the balun may function as a Marchand balun at low frequency and a back-wave balun at high frequency. The first reactance may be a capacitive reactance, the second reactance an inductive reactance and the balun may function as a Marchand balun at high frequency and a back-wave balun at low frequency. There may be a grounding capacitive reactance connected between the first and second primary sections and ground. The grounding capacitive reactance may include first and second capacitances connected from each end of the inductive reactance to ground and a third capacitance connected from the free end of the secondary primary section to ground and the free end of the first primary section may be connected to the single port of the balun. A grounding inductive reactance may be connected from the first and second secondary sections to ground. The grounding inductive reactance may include first and second inductances connected from one end of each secondary section to ground; the other ends of the secondary sections may be the balanced balun ports. A grounding inductive reactance may be connected between the first and second primary sections and ground. The grounding inductive reactance may include first and second inductances connected from each end of the capacitive reactance to ground and a third inductance connected from the free end of the second primary section to ground and the free end of the first primary section may be connected to the single port of the balun. There may be a grounding capacitive reactance connected from the first and second secondary sections to ground. The grounding capacitive reactance may include first and second capacitances connected from one end of each secondary section to ground. The other ends of the secondary sections may be the balanced balun ports. The balun may be a distributed balun and the coupled sections may be transmission line sections. The balun may be a lumped balun and the coupled sections may be transformer sections. One of the first and second reactances may be capacitive reactances and the other may be an inductive reactance and they may be implemented by parasitic capacitance and parasitic inductance of the coupled sections, respectively. The grounding capacitive reactance may be implemented by the parasitic capacitance of coupled sections. The grounding inductive reactance may be implemented by the parasitic inductance of the coupled sections.

This invention also features a hybrid Marchand/back-wave balun including a first pair of coupled sections having a first primary section and first secondary section and a second pair of coupled sections having a second primary section and second secondary section. There is a first inductive reactance interconnecting to an IF port of the first and second secondary sections. The first inductive reactance may include first and second inductances connected from one end of each secondary section to the IF port. A second inductive reactance may be connected between the first and second primary sections. The first and second inductive reactances are open at high frequency and shorted at low frequency, for selectively providing low frequency Marchand function and high frequency back-wave function and an accessible IF port.

In a preferred embodiment there may be a first grounding capacitive reactance connected between the first inductive reactance connected to the first and second secondary sections and ground. The first grounding capacitive reactance may include first and second capacitances connected from ground to the IF port and the end of the first inductive reactance that is in series with the first and second secondary sections. There may be a second capacitive reactance connected from the first and second primary sections to ground. The second grounding capacitive reactance may include first and second capacitances connected from each end of the second inductive reactance to ground and a third capacitance connected from the free end of the second primary section to ground.

This invention also features a double balanced mixer with hybrid Marchand/back-wave baluns including a first hybrid Marchand/back-wave balun for receiving a first single input and providing a first balanced output and a second hybrid Marchand/back-wave balun for receiving a second single input and providing a second balanced output.

There is a balanced mixer core responsive to the first and second balanced outputs to provide a mixed signal from the first and second single inputs. Each of the hybrid Marchand/back-wave balun may include a first pair of coupled sections having a first primary section and first secondary section and a second pair of coupled sections having a second primary section and second secondary section. There is a first reactance interconnecting the first and second primary sections and a second reactance interconnecting the first and second secondary sections. One of the reactances may be open at high frequency and shorted at low frequency, the other reactance may be shorted at high frequency and open at low frequency for selectively providing low frequency Marchand/high frequency back-wave function and high frequency Marchand/low frequency back-wave function.

In a preferred embodiment there may be an impedance transforming/matching network interconnected between the balanced mixer core and the balanced outputs of each of the hybrid baluns. The first reactance may be an inductive reactance; the second reactance may be a capacitive reactance and the balun may function as a Marchand balun at low frequency and a back-wave balun at high frequency. The first reactance may be a capacitive reactance, and the second reactance may be an inductive reactance and the balun may function as a Marchand balun at high frequency and a back-wave balun at low frequency. One of the first and second reactances may be a capacitive reactance and the other may be an inductive reactance and they may be implemented by parasitic capacitance and parasitic inductance of the coupled sections, respectively.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
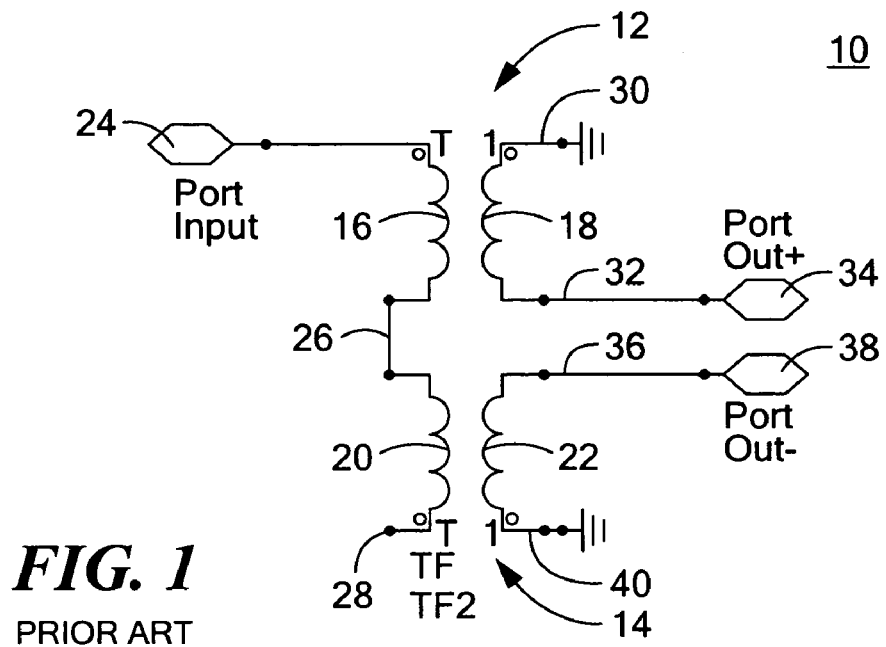
FIGS. 1 and 2 are schematic diagrams of a prior art lumped and distributed Marchand balun, respectively.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

This invention relates to a passive balun that transforms power between single ended and differential or balanced circuits or conversely between balanced or differential and single ended circuits, and relates particularly but not exclusively to balun circuits for use in radio frequency (RF) and microwave frequency mixers, push pull doublers, balanced amplifiers, and the like. To overcome the limitations of Marchand and back-wave baluns the invention combines the DC-bias-preference and wide band advantages of Marchand and back-wave baluns. In addition, the invention overcomes the fabrication difficulties of strip-line baluns and can be readily implemented with most available planar and semiconductor integrate-circuit (IC) fabrication process. Impedance transforming/matching networks are also shown along with the balun since in most RF and microwave applications the power is transformed from a 50 ohms source single ended to differential or balanced branches that are loaded with complex impedance of non-linear devices such as in balanced mixer or push-pull amplifier designs.

Figure 2:
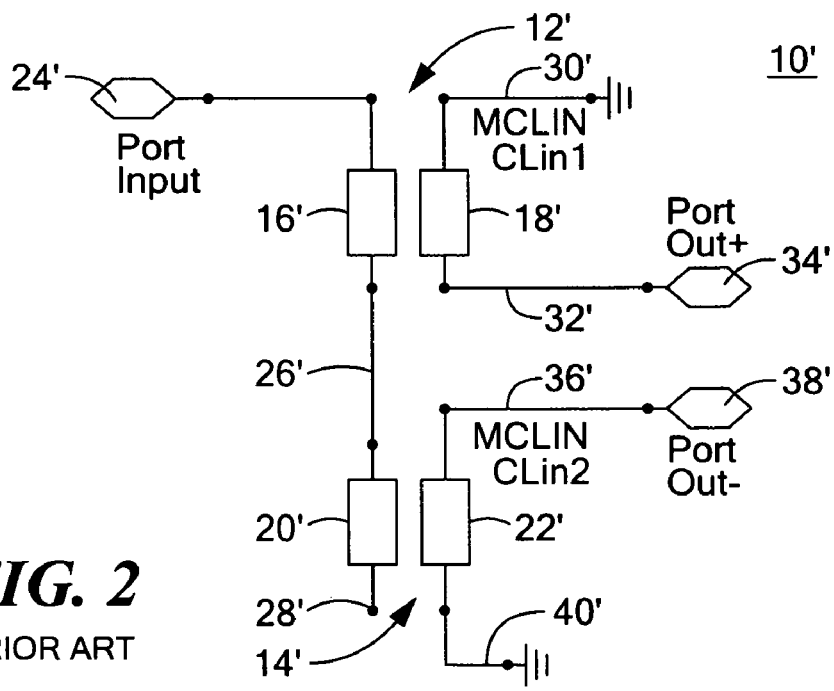

There is shown in FIG. 1 a conventional prior art Marchand balun 10 using lumped elements. Balun 10 includes a first pair of coupled sections 12 and a second pair of coupled sections 14. Coupled section 12 includes a first primary section 16 and a first secondary section 18. Couple sections 14 include a second primary section 20 and a second secondary section 22. Primary section 16 has one end connected to input port 24 while the other end is connected directly via line 26 to second primary section 20 whose other end is open at 28. First secondary section 18 has one end connected to ground 30 and the other end 32 connected to one of the balanced or differential output ports 34. Second secondary section 22 also has one end 36 connected to the other differential or balanced output port 38. The other end 40 of secondary section 22 is connected to ground. Although the single ended port 24 is referred to as the input port and the differential or balanced ports 34 and 38 are referred to as the output ports, this is not a necessary limitation of the invention, as is the case with every balun both conventional and those involving the invention described herein. The balun in concept can be bi-directional, that is, the single ended port may be the input and the balanced or differential ports may be the output as shown throughout this disclosure but the balanced or differential ports may as well be the inputs and the single ended port may be the output. In FIG. 1, the coupled sections 12 and 14 are formed of lumped elements 16, 18, and 20, 22, respectively. In this case, the section 16 and 18 and 20 and 22 may be referred to as transformer sections. The prior art balun 10 of FIG. 1, may also be implemented as a distributed balun 10', FIG. 2, where the sections 16', 18', 20' and 22' are referred to as transmission line sections.

Figure 3:
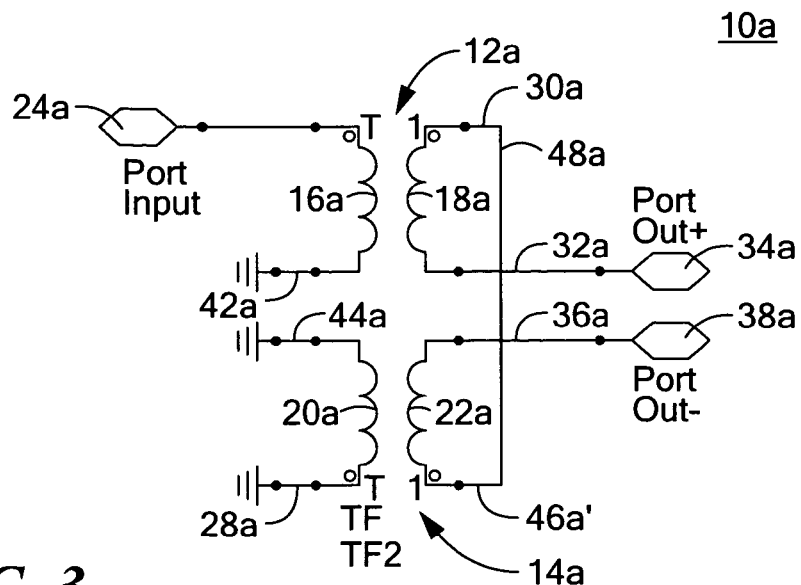
FIGS. 3 and 4 are schematic diagrams of a prior art lumped and distributed back-wave balun, respectively.
Figure 4:
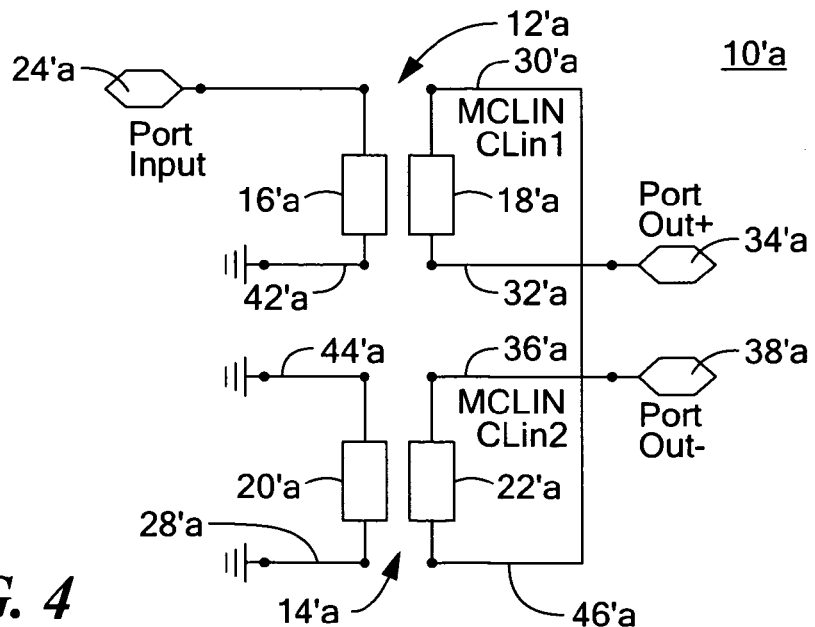

In contrast to a conventional prior art Marchand balun, a conventional prior art back-wave balun 10a, FIG. 3, has its first primary section 16a, connected to port 24a, but its other end instead of being connected directly to second primary section 20a is connected to ground at 42a and both ends of second primary section 20a are connected to ground at 44a and 28a. The end of each secondary section 18a, and 22a, shown at 32a and 38a are connected to ports 34a and 38a. However, the other ends 30a and 46a are not connected to ground as was the case with the Marchand balun but are connected to each other over line 48a. Since balun 10a, FIG. 3, is a lumped element version section 16a, 18a, 20a, and 22a may be referred to as transformer sections. In contrast in a distributed transmission line version, FIG. 4, those sections labeled 16'a, 18'a, 20'a, and 22'a, may be referred to as transmission line sections. Other than that balun 10'a in FIG. 4, has the same connections as balun 10a in FIG. 3.

Figure 5:
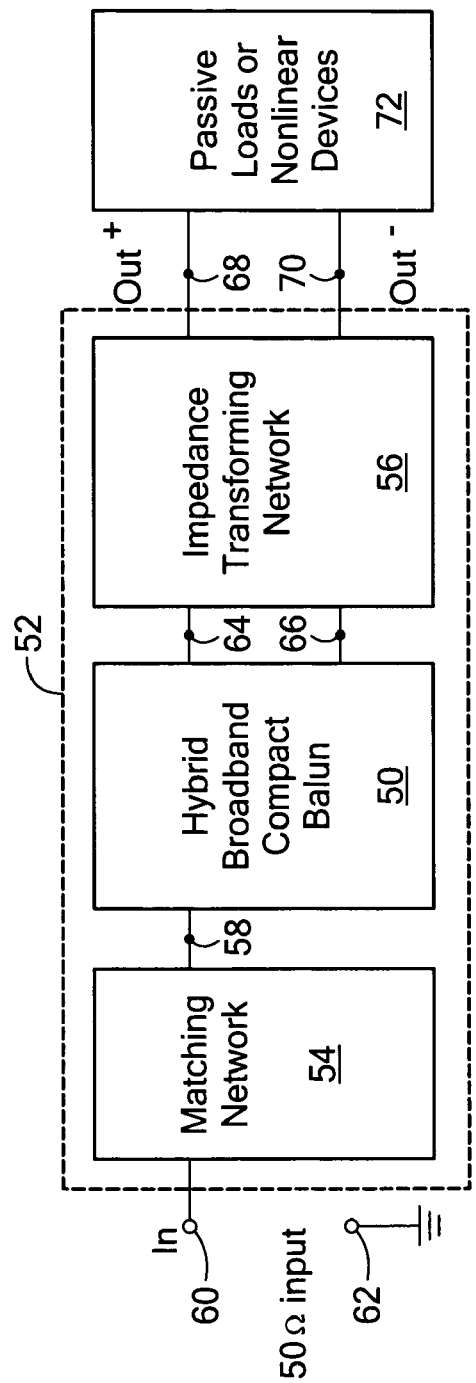
FIG. 5 is a block diagram of a hybrid Marchand/back-wave balun according to this invention in a balun structure.

In one application the hybrid balun 50, FIG. 5, of this invention may be included in a balun structure 52 which includes a matching network 54 and an impedance transforming network 56. Hybrid balun 50 may receive at its single ended port 58, an input from matching network 54 which in turn receives a 50 ohm input at terminals 60 and 62. The differential or balanced output at ports 64 and 66 of hybrid balun 50 is provided to impedance transforming network 56 which provides the ultimate output at terminals 68 and 70 to a typical passive load or non-linear device 72.

Figure 6:
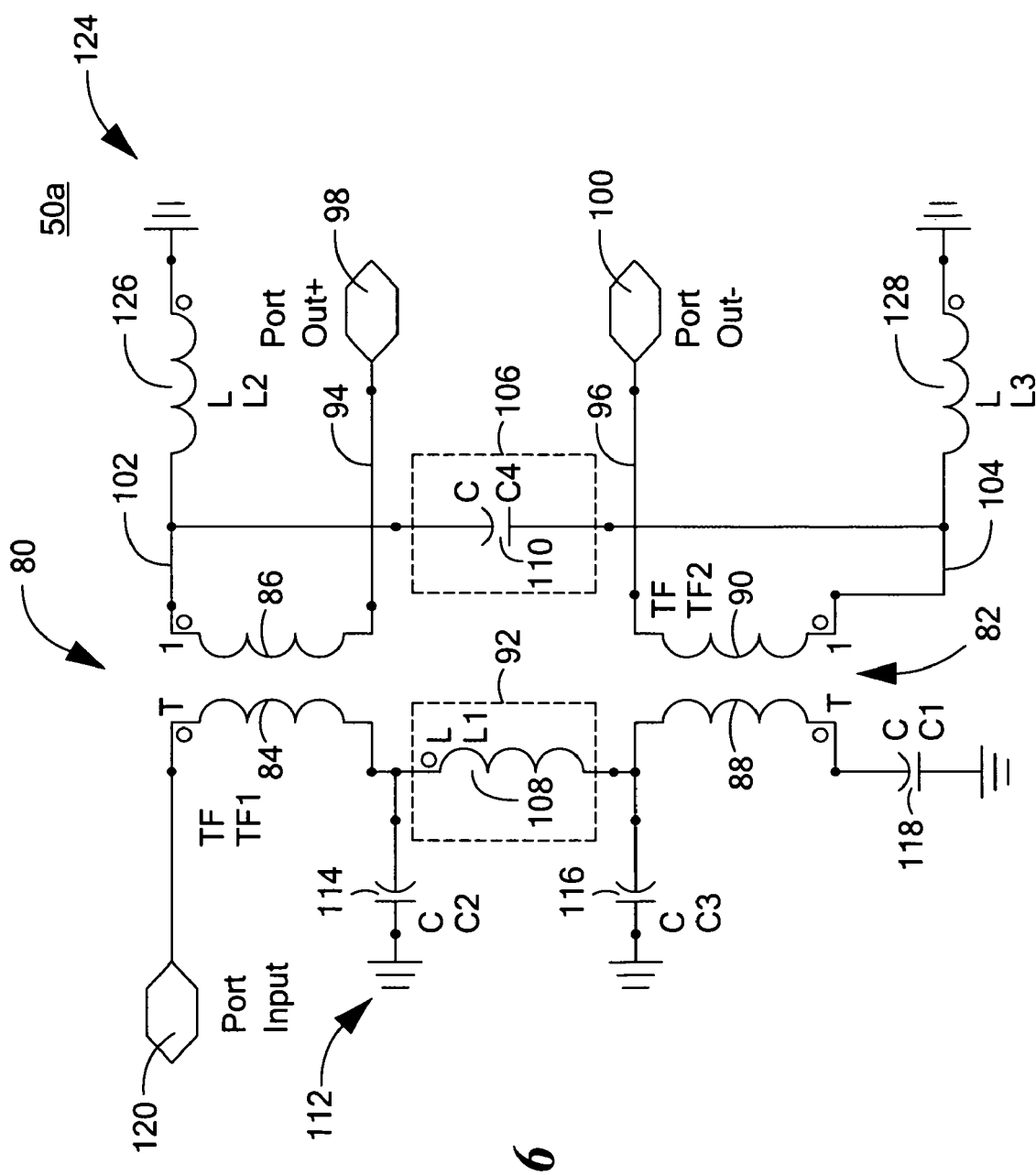
FIG. 6 is a schematic diagram of a lumped hybrid Marchand/back-wave balun according to this invention which functions as a Marchand balun at low frequency and back-wave balun at high frequency.

A lumped element version of a hybrid balun 50a, according to this invention, FIG. 6, functions as a Marchand type balun at low frequency and as a back-wave balun at high frequency. There is a pair of coupled sections 80 and a pair of coupled sections 82. Coupled sections 80 include a first primary section 84 and a first secondary section 86. The other pair of coupled sections includes a second primary section 88 and a second secondary section 90. Primary sections 84 and 88 are interconnected by a reactance 92. Secondary sections 86 and 90 each have one end 94, 96 connected to ports 98 and 100. The other ends 102, 104 are connected together to a second reactance 106. In FIG. 6, reactance 92 is shown as an inductive reactance 108, while reactance 106 is shown as a capacitive reactance 110. Inductance 108 is a short at low frequency so balun 50a behaves like a Marchand balun but inductance 108 is open at high frequency so then balun 50a functions as a back-wave balun. Capacitive reactance 110 on the other hand acts as a short at high frequency so the device functions as a back-wave balun but an open at low frequency so the device operates as a Marchand balun. There may also be a grounding reactance 112 associated with primary sections 84 and 88 which may include capacitive reactance 114, 116 and 118. Capacitive reactance 114 and 116 are connected from either side of inductive reactance 108 to ground while capacitive reactance 118 is connected from the other end of second primary section 86 to ground. The free end of first primary section 84 is connected to port 120. There may also be an inductive grounding reactance 124 including inductive reactances 126, and 128 associated with first and second secondary sections 86 and 90. Capacitive reactances 114 and 116 are open at low frequency in the nature of Marchand balun and are shorted at high frequency in the nature of a back-wave balun. Inductive reactances 126 and 128 are shorted at low frequency in the nature of a Marchand balun and are open at a high frequency in the nature of back-wave balun. Here again, although port 120 is shown as an input port it may be the output port and although ports 98 and 100 are shown as the output ports they may be in the input ports. Since this is a lumped element version of the hybrid balun of this invention sections 84, 86, 88 and 90 may be referred to as transformer sections. Reactances 92, 92', 92a, 92'a, and 106, 106', 106a, and 106'a may be implemented, selectively, by the parasitic capacitive reactance and parasitic inductive reactance of the coupled sections.

Figure 7:
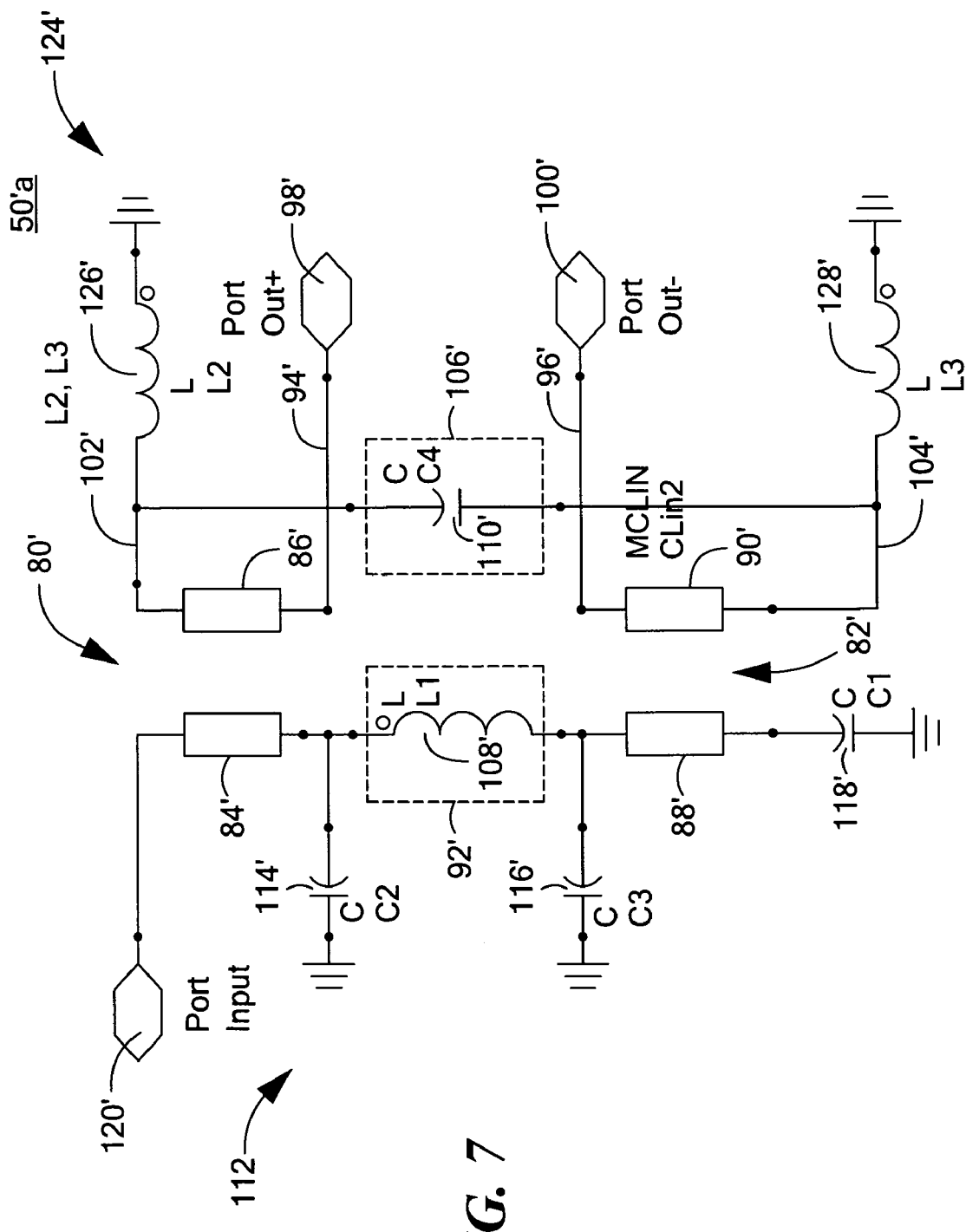
FIG. 7 is a schematic diagram of a distributed hybrid Marchand/back-wave balun according to this invention which functions as a Marchand balun at low frequency and back-wave balun at high frequency.

A distributed version of the hybrid balun 50'a of this invention is shown in FIG. 7, where once again it functions as a Marchand type balun at low frequency and a back-wave type balun at high frequency. Here the connections are all the same except that the sections 84', 86', 88' and 90' are shown as transmission line sections.

Figure 8:
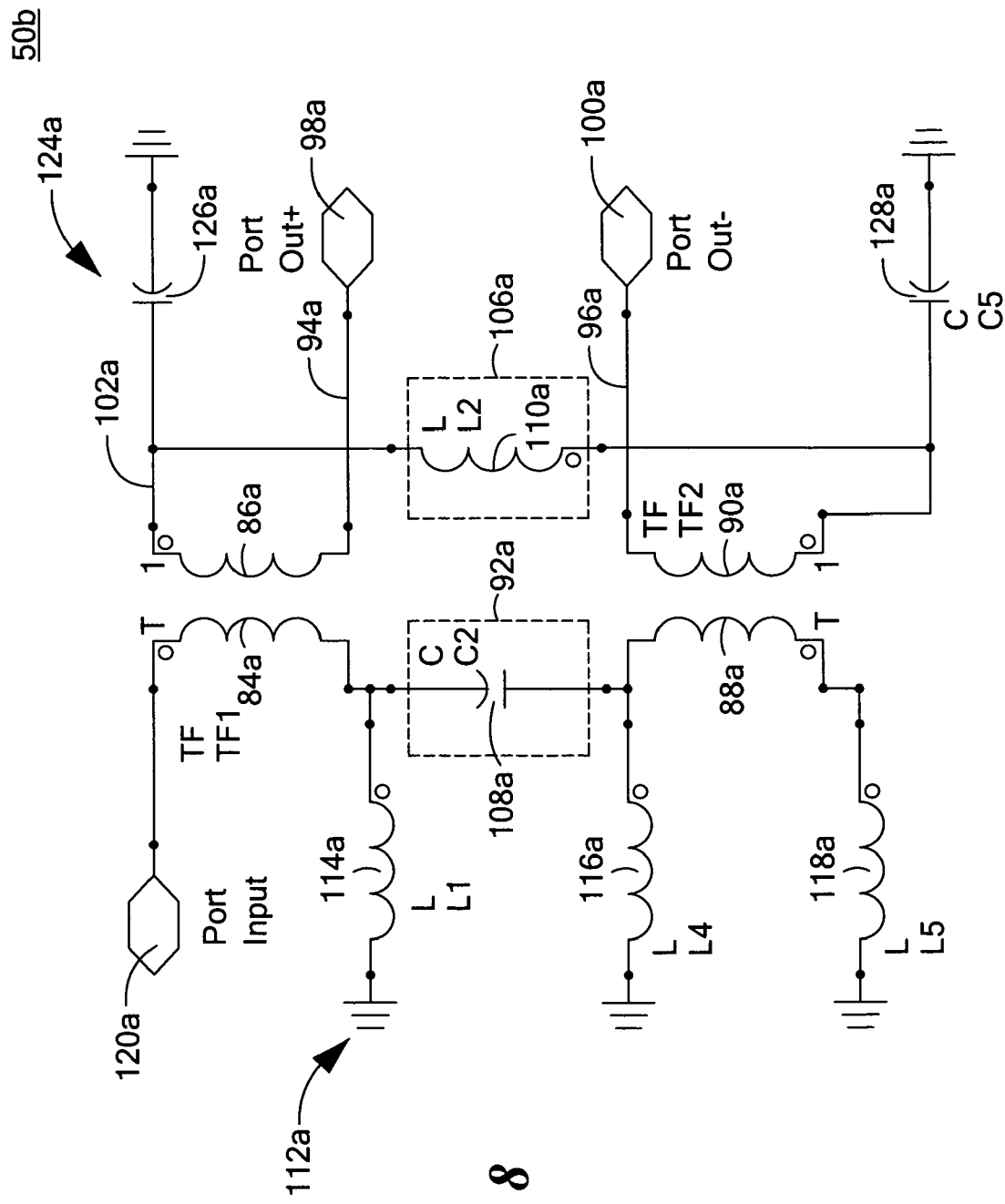
FIG. 8 is a schematic diagram of a lumped hybrid Marchand/back-wave balun according to this invention which functions as a back-wave balun at low frequency and Marchand balun at high frequency.
Figure 9:
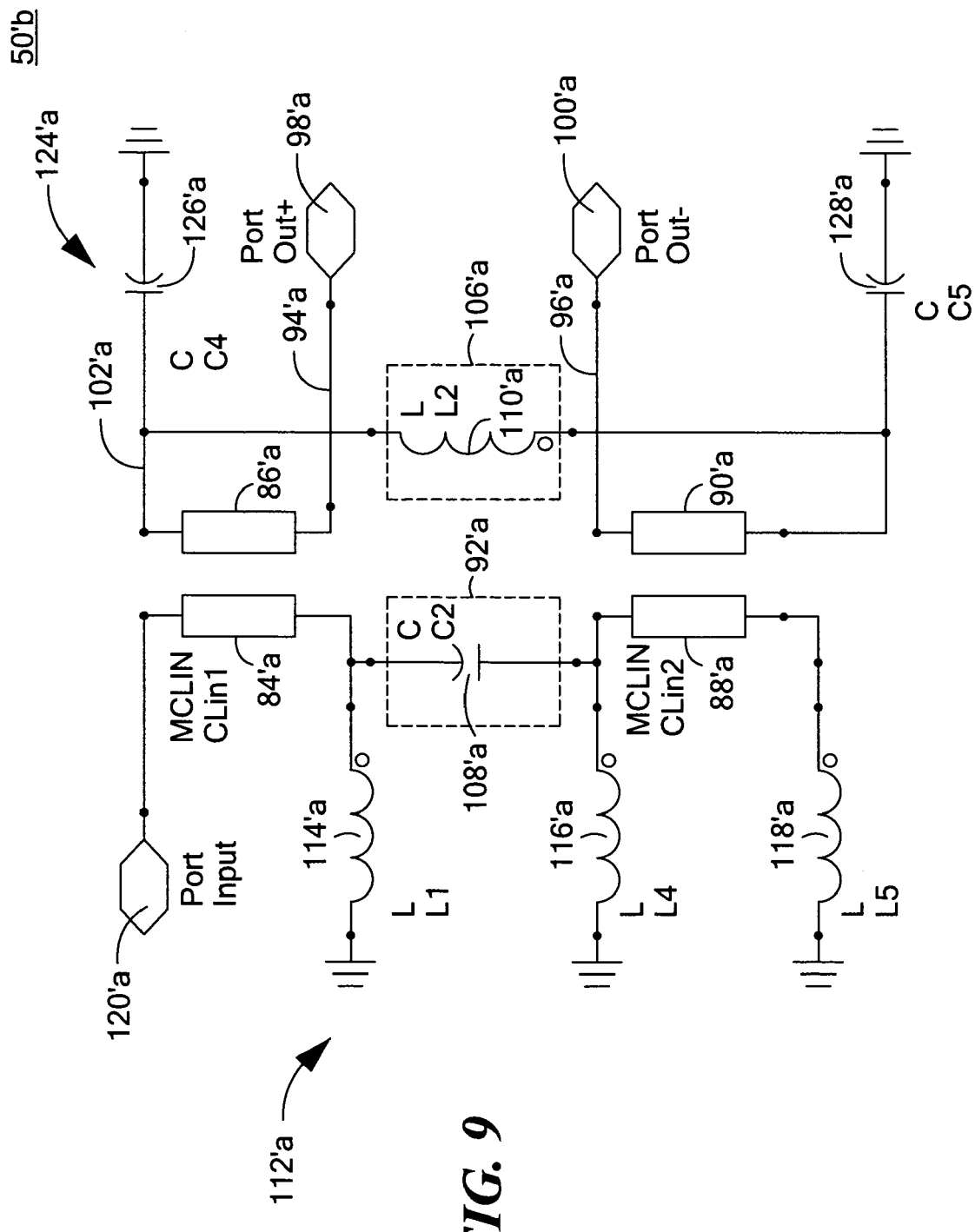
FIG. 9 is a schematic diagram of a distributed hybrid Marchand/back-wave balun according to this invention which functions as a back-wave balun at low frequency and Marchand balun at high frequency.

By swapping the types of reactances associated with the primary sections and the secondary sections, a hybrid balun according to this invention 50b, FIG. 8, may be constructed wherein it performs as a Marchand type balun at high frequency and a back-wave type balun at low frequency. Hybrid balun 50b is similar to hybrid balun 50a, but here the reactance 92a is implemented with a capacitive reactance 108a and reactance 106a is implemented with an inductive reactance 110a. In addition to swapping the nature of reactances 92a and 106a with respect to their inductive and capacitive natures the grounding reactances 112a and 124a have been swapped in the same fashion so that grounding reactances 114a, 116a, and 118a are now inductive reactances and the grounding reactances 126a and 128a are now capacitive reactances. Here inductive reactances 114a, 116a and 118a provide a short at low frequency in the nature of a back-wave balun and an open at high frequencies in the nature of a Marchand balun. This presents the open needed by the Marchand type balun at high frequency and provides the needed grounds for the back-wave balun at low frequency. Capacitances 126a and 128a provide a short at high frequency in the nature of a Marchand balun and an open at low frequency in the nature of a back-wave balun. Thus, they present the open needed for back-wave balun at low frequency and the short needed for the Marchand balun at high frequency. Hybrid balun 50b is shown as a lumped element version but it too, of course, may be implemented in a distributed version 50'b, FIG. 9, where primary sections 84'a, 86'a, and secondary sections 88'a and 90'a are shown as transmission line sections.

Figure 10:
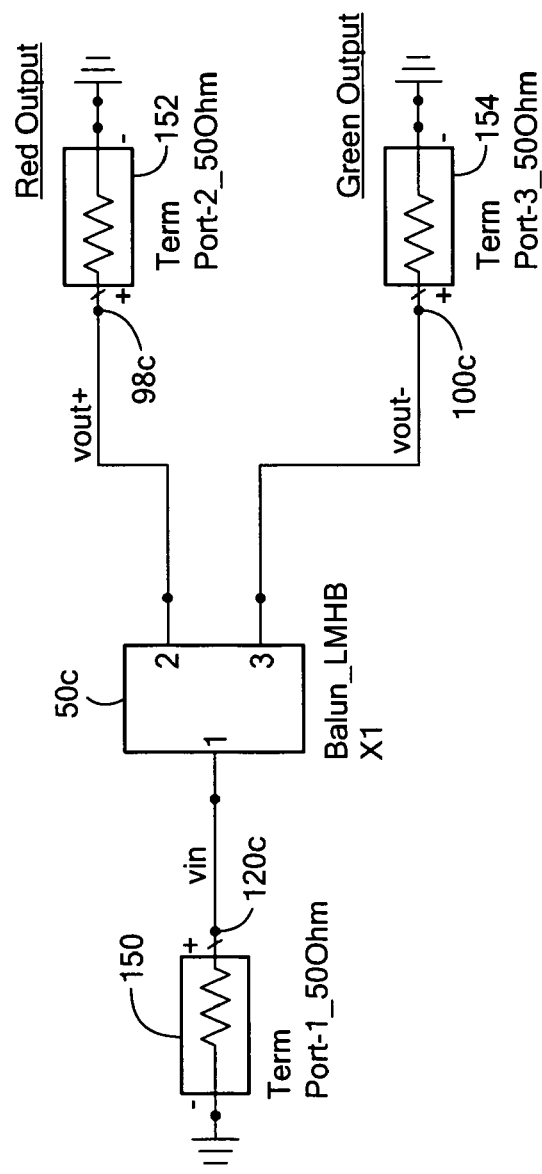
FIG. 10 is a bench circuit example of a 50 ohm to 50 ohm single-ended-to-balanced or differential balun according to this invention.
Figure 11:
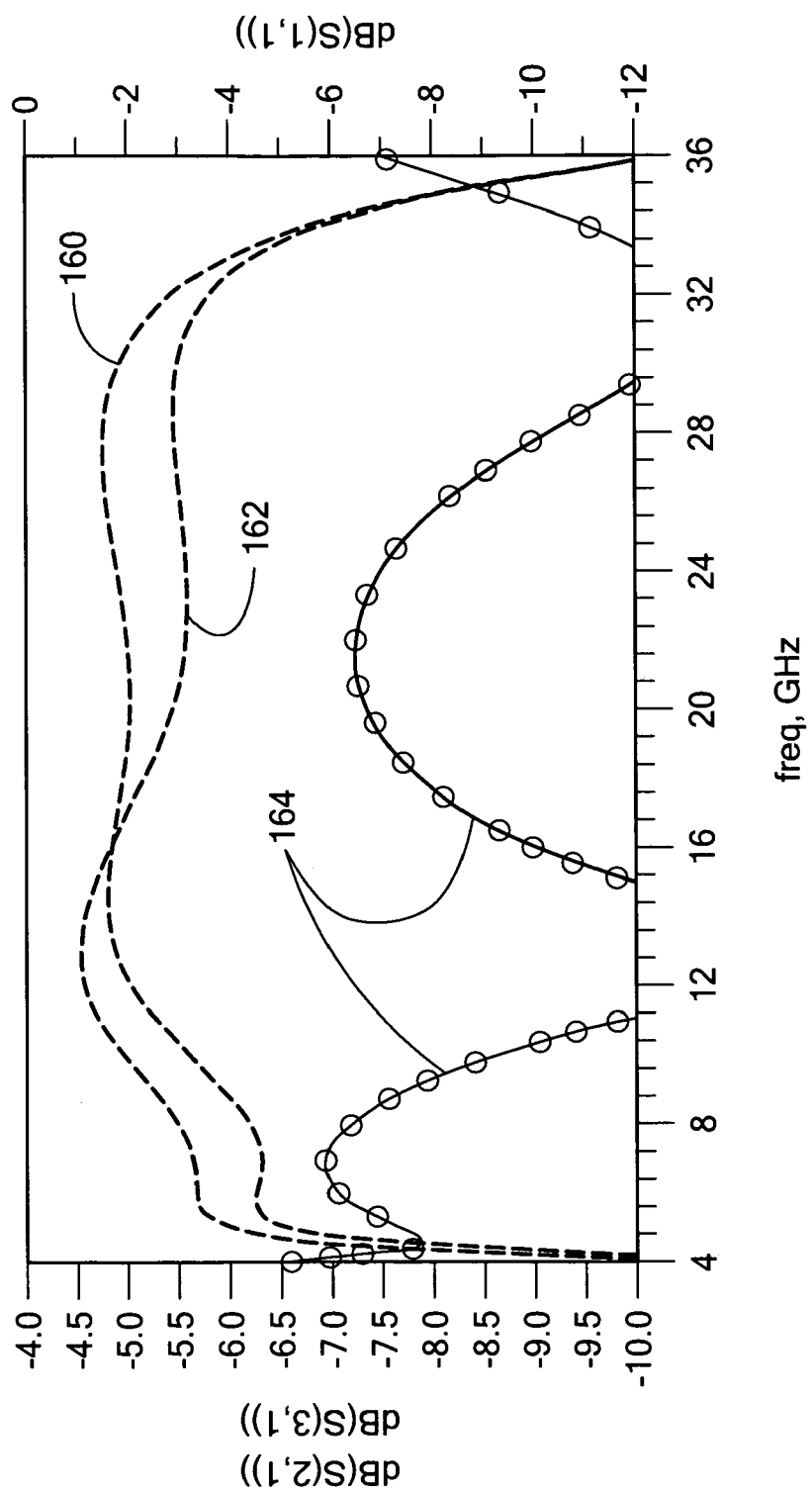
FIG. 11 is a graph showing absolute power transmitted and reflected for the balun of FIG. 10.
Figure 12:
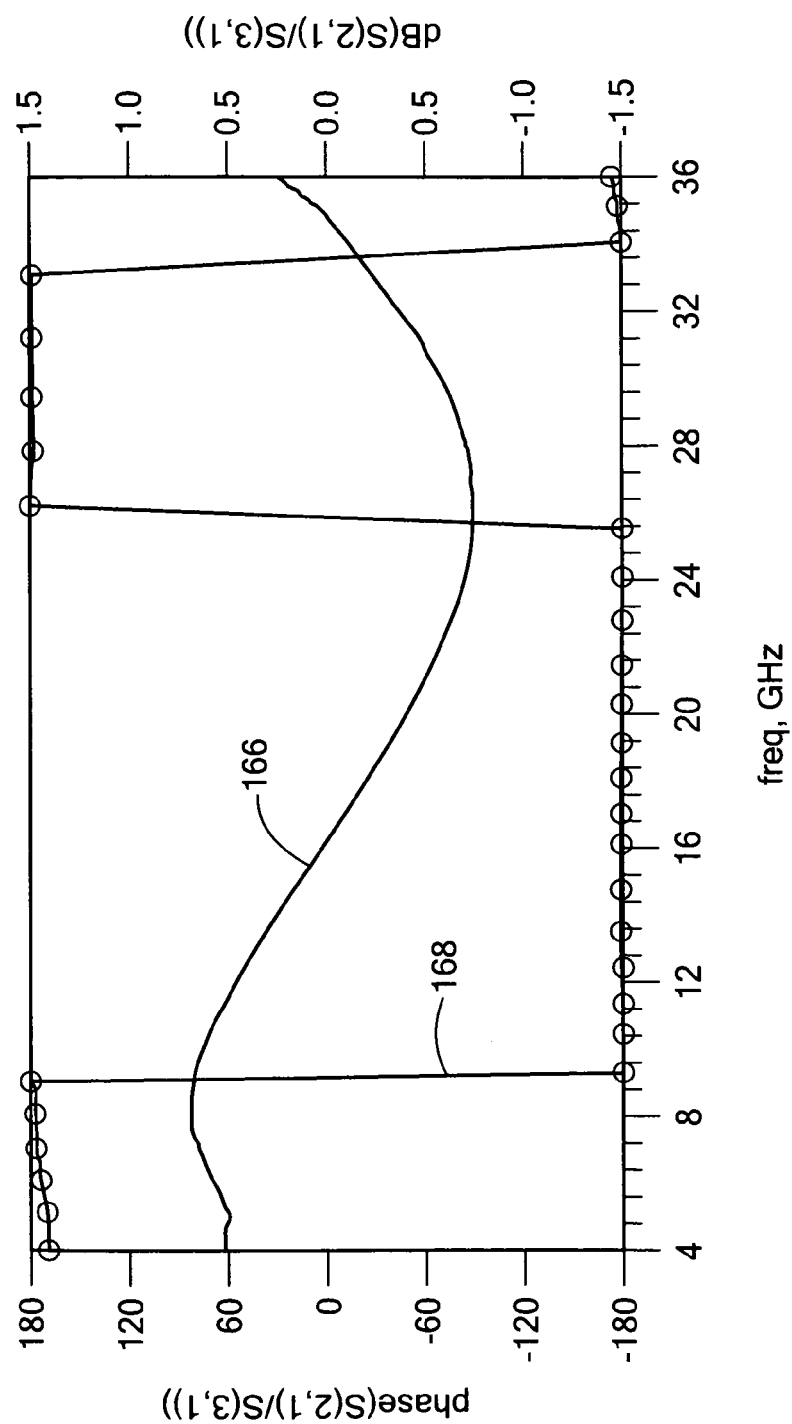
FIG. 12 is a graph showing relative power and phase balance for the differential outputs of the balun in FIG. 10.

The hybrid balun 50c, FIG. 10, of this invention was employed with a 50 ohm input 150 at port 120c (port 1) and providing a differential or balanced output on ports 98c and 100c (ports 2 and 3, respectively) also at 50 ohms 152, 154. The improved results are shown in FIGS. 11 and 12. In FIG. 11 the performance of the balun 50c, shows that the transmitted power between ports 3 and 1 160, FIG. 11, and between ports 2 and 1, 162 have a broad band between 4 and 36 GHz, while the reflected power at port 1, 164 was quite good. The relative power balance 166, FIG. 12, between output ports one-to-two and ports one-to-three, was also close to zero on average which is quite good and showed a phase difference of 180-degree between ports one-to-two and one-to-three at 168.

In further accordance with the invention the hybrid balun may be used with a double balanced mixer to great advantage. Such a double balance mixer 200, FIG. 13, includes a balanced mixer core 202 being supplied by two hybrid baluns 204, 206 according to this invention. There may also be impedance transforming networks 208, 210 as conventionally used. The balanced mixer cores of conventional design can be either diode based or FET based. One input, LO, is provided at port 212; the other input to be mixed, RF, is provided at port 214. These are single ended ports in this embodiment. Hybrid balun 204 provides differential or balanced outputs LO+ and LO− which are delivered to balanced mixer core 202. Hybrid balun 206 receiving input RF at port 214 provides a balanced or differential output RF+ and RF−. This mixer 200 with the use of the hybrid baluns according to this invention provides good isolation of LO and RF and it also provides improved broad band mixed signal output LO−RF, or IF. The IF output being provided at hybrid balun 206 is typically a common mode signal and can be extracted elsewhere. That is, the location of the IF port 216 can be changed according to application requirements. It's possible to extract the IF signal either from the LO side of the balun or from the impedance transforming networks 208 or 210 or from the mixer core 202. The IF signal can also be single ended or balanced or differential.

Figure 13:
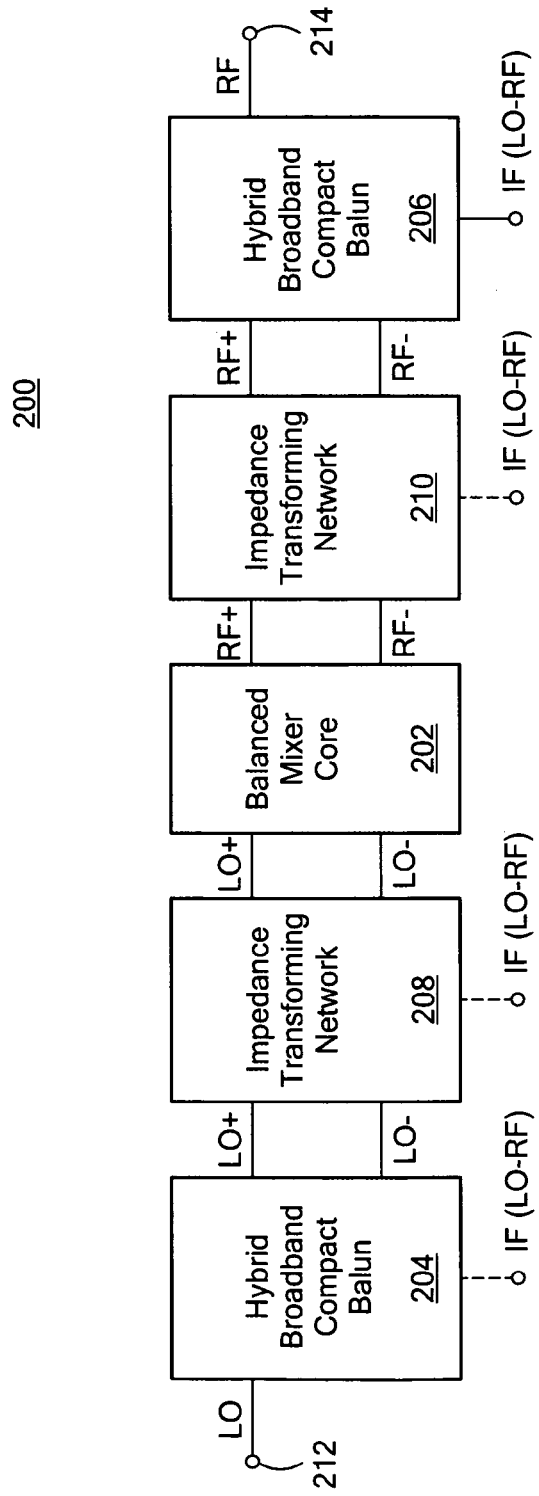
FIG. 13 is a block diagram of a double balanced mixer using baluns according to this invention.
Figure 14:
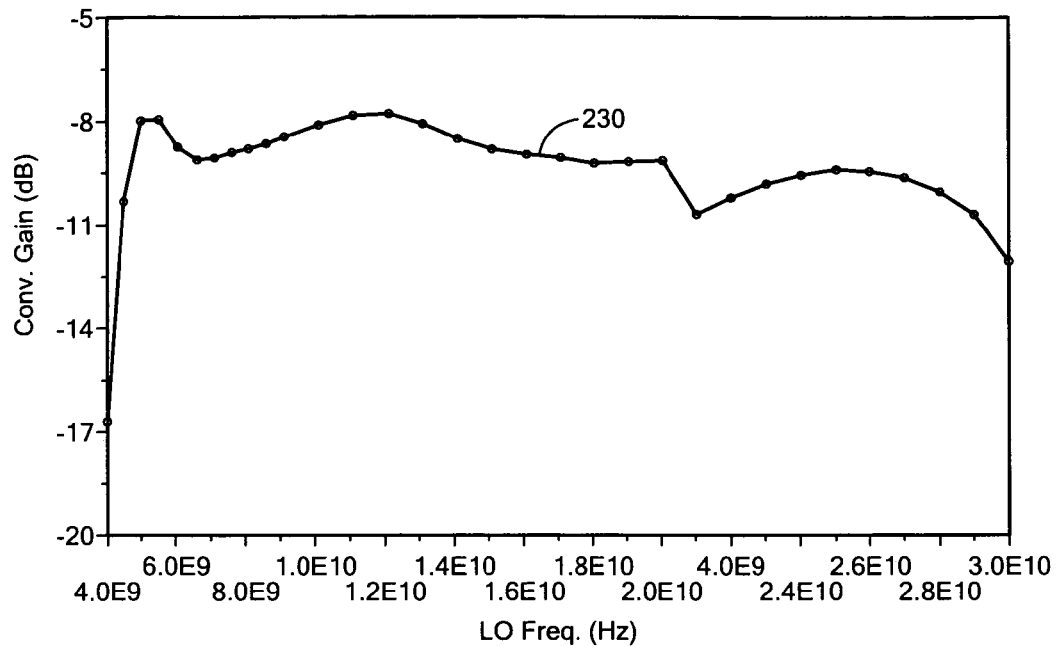
FIG. 14 is a graph showing transmitted power ratio for the mixer of FIG. 13.
Figure 15:
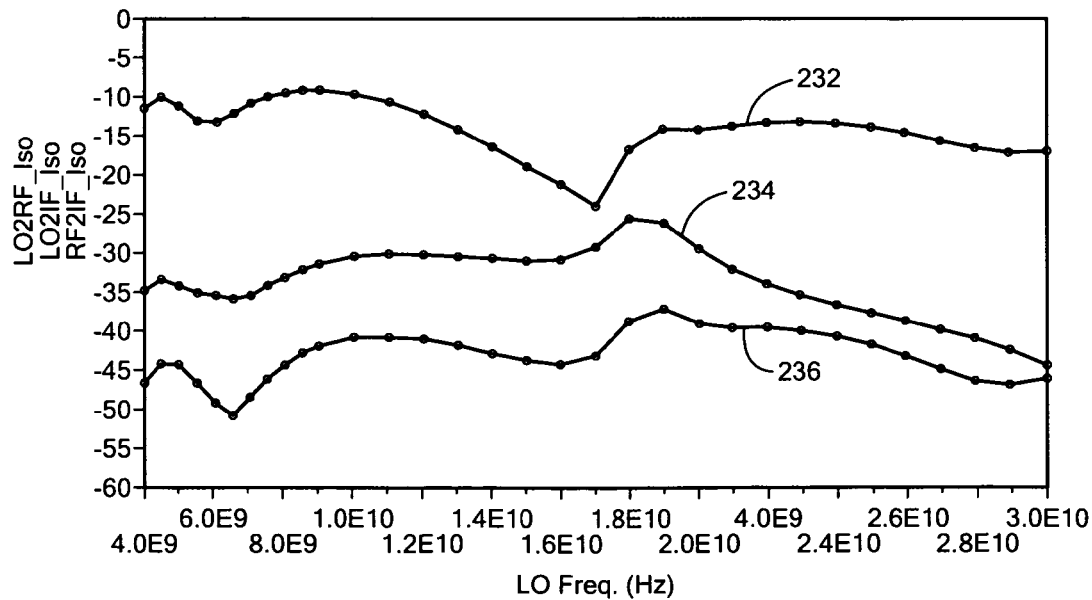
FIG. 15 is a graph showing port-to-port isolation for the mixer of FIG. 1-3.
Figure 16:
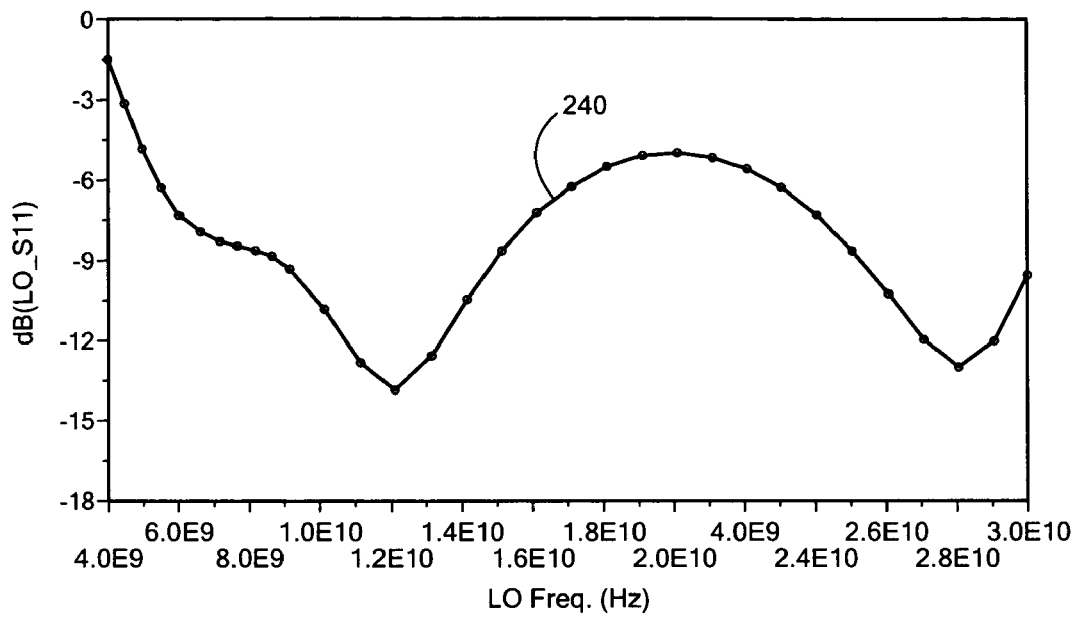
FIGS. 16 and 17 are graphs showing the reflected power for each of the balun's inputs in FIG. 13.
Figure 17:
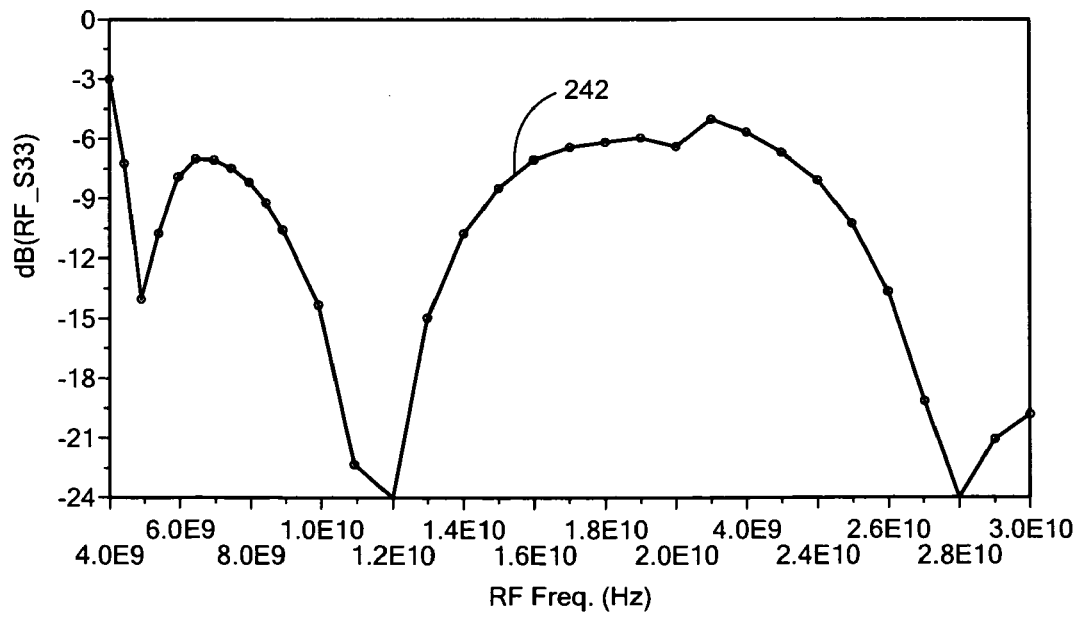

The signal converting efficiency and other performances of the balanced mixer of FIG. 13 is shown in FIGS. 14 through 17. FIG. 14 discloses the signal converting efficiency from RF to IF/LO−RF port at 230, which shows a broad band characteristic from 4 GHz to 30 GHz. The port to port isolation is also shown to be excellent in FIG. 15, which shows the isolation from RF to IF/LO−RF at 232, the isolation of LO to IF/LO−RF at 234 and the LO to RF isolation at 236, again from 4 to 30 GHz. The return loss or reflected power of LO port is shown at 240, FIG. 16, illustrating a good characteristic from 4 to 30 GHz and the reflective power of RF port level 242 also shows a good characteristic from 4 to 30 GHz.

Figure 18:
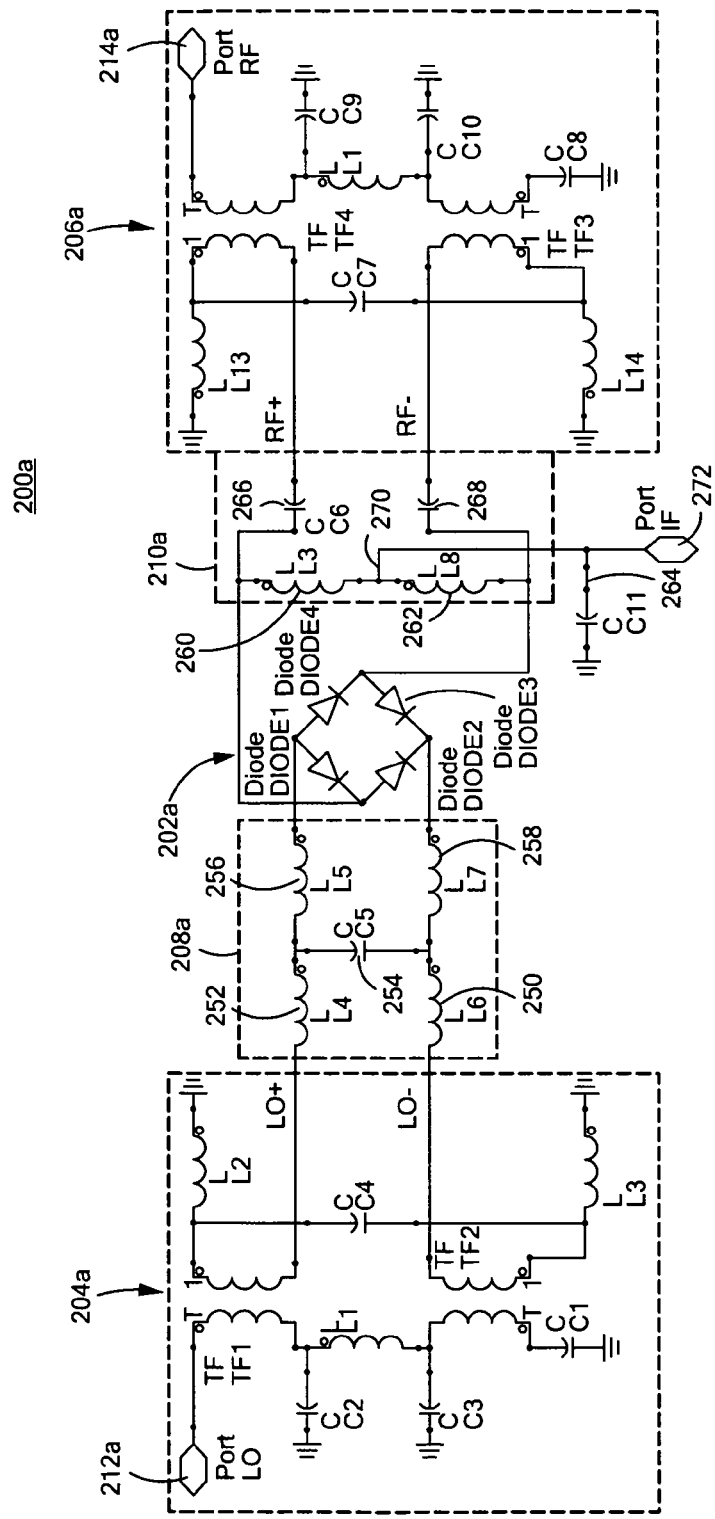
FIG. 18 is a schematic diagram of a double balanced mixer using baluns according to this invention.

FIG. 18 shows the detailed schematic of one version of double balanced mixer designed based on the hybrid balun invention. Such a double balance mixer 200a, FIG. 18, includes a balanced diode mixer core 202a being driven by two hybrid baluns 204a and 206a according to this invention. The impedance transforming network 208a on the LO side is implemented using a low-pass network including inductors 250, 252, 256, 258 and capacitor 254. The impedance transforming network 210a on the RF side is implemented using a high-pass network including capacitors 266, 268 and inductors 260, 262. The central common node 270 of inductors 260 and 262 is used as the IF port 272 to extract the low-frequency mixed product (LO–RF) of LO and RF signals. Filtering capacitor 264 helps to filter out the high order mixed products as well as LO and RF leakages at the IF port 272.

Figure 19:
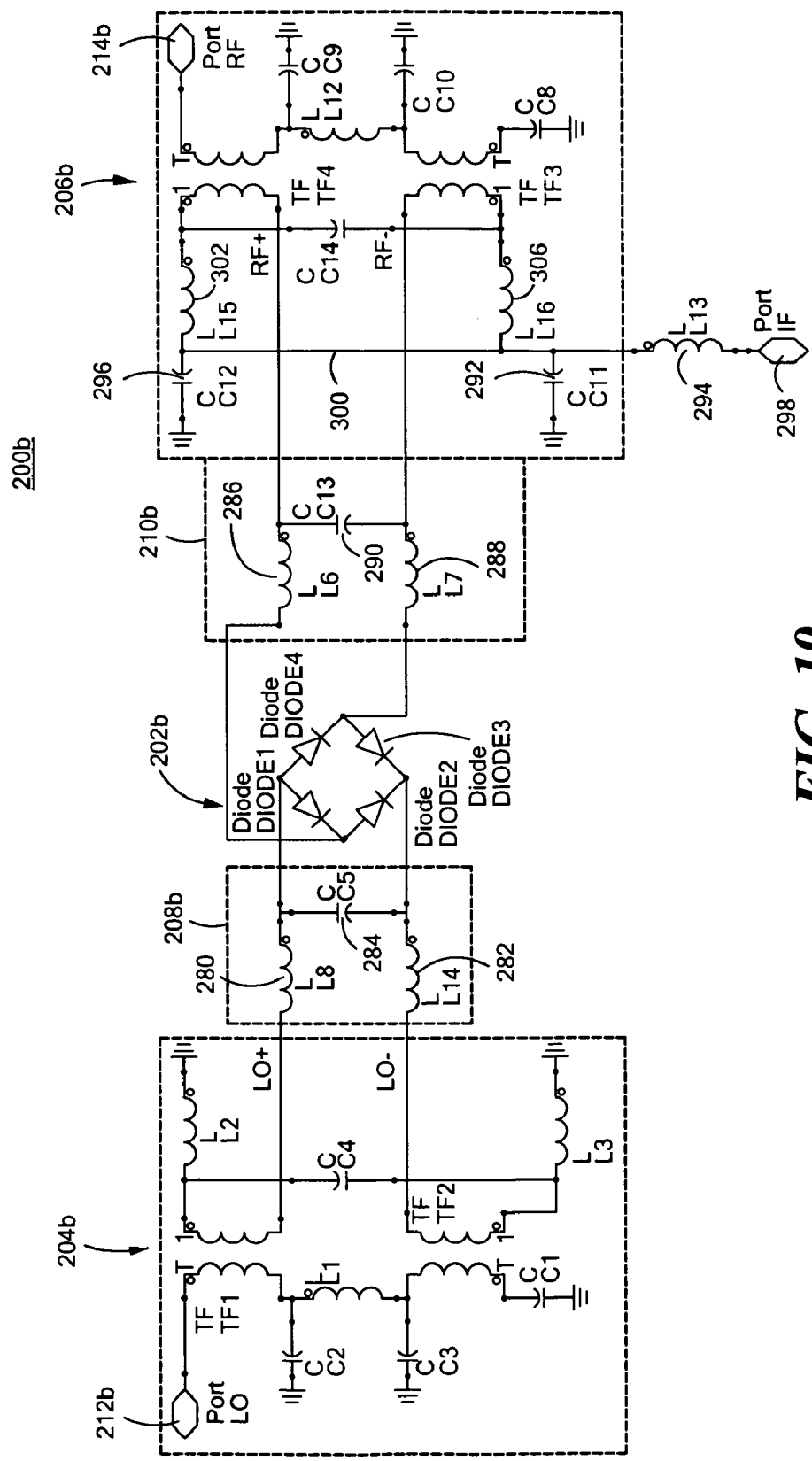
FIG. 19 is a schematic diagram of a double balanced mixer using baluns according to this invention.

FIG. 19 shows the detailed schematic of another version of double balanced mixer designed based on the hybrid balun invention. Such a double balance mixer 200b, FIG. 19, includes a balanced diode mixer core 202b being driven by two hybrid baluns 204b and 206b according to this invention. The impedance transforming network 208b on the LO side is implemented using a low-pass network including inductors 280, 282 and capacitor 284. The impedance transforming network 210b on the RF side is implemented using a low-pass network including inductors 286, 288 and capacitor 290. The balun 206b on RF side is modified from the hybrid balun 50a in FIG. 6 by using the capacitors 296, 292 as the AC ground of inductors 302 and 306 in FIG. 19. In this way, the RF balun still operates as a Marchand balun at the low-end of the band and as a back-wave balun at high frequency, and provides a convenient extracting point for mixed product (IF port at 298) at node 300. Similar to capacitor 264 in FIG. 18, capacitors 296, 292 and inductor 294 help to filter out the high order mixed products as well as LO and RF leakages at the IF port 298. This modified RF balun 206b presents an efficient topology for mixed signal extraction in the mixer applications.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A hybrid Marchand/back-wave balun comprising:
a first pair of coupled sections having a first primary section and first secondary section;
a second pair of coupled sections having a second primary section and second secondary section;
a first reactance interconnecting said first and second primary sections and a second reactance interconnecting said first and second secondary sections;
one of said reactances being open at high frequency and shorted at low frequency, the other reactance being shorted at high frequency and open at low frequency for selectively providing low frequency Marchand/high frequency back-wave function and high frequency Marchand/low frequency back-wave function.

2. The hybrid Marchand/back-wave balun of claim 1 in which said first reactance is an inductive reactance said second reactance is a capacitive reactance and said balun functions as a Marchand balun at low frequency and a back-wave balun at high frequency.

3. The hybrid Marchand/back-wave balun of claim 1 in which said first reactance is a capacitive reactance said second reactance is an inductive reactance and said balun functions as a Marchand balun at high frequency and a back-wave balun at low frequency.

4. The hybrid Marchand/back-wave balun of claim 2 further including a grounding capacitive reactance connected between said first and second primary sections and ground.

5. The hybrid Marchand/back-wave balun of claim 4 in which said grounding capacitive reactance includes first and second capacitances connected from each end of said inductive reactance to ground and a third capacitance connected from the free end of said second primary section to ground and said free end of said first primary section being connected to the single port of the balun.

6. The hybrid Marchand/back-wave balun of claim 2 further including a grounding inductive reactance connected from said first and second secondary sections to ground.

7. The hybrid Marchand/back-wave balun of claim 6 in which said grounding inductive reactance includes first and second inductances connected from one end of each secondary section to ground, the other ends of said secondary sections being the balanced balun ports.

8. The hybrid Marchand/back-wave balun of claim 3 further including a grounding inductive reactance connected between said first and second primary sections and ground.

9. The hybrid Marchand/back-wave balun of claim 8 in which said grounding inductive reactance includes first and second inductances connected from each end of said capacitive reactance to ground and a third inductance connected from said the free end of said second primary section to ground and said free end of said first primary section being connected to the single port of the balun.

10. The hybrid Marchand/back-wave balun of claim 3 further including a grounding capacitive reactance connected from said first and second secondary sections to ground.

11. The hybrid Marchand/back-wave balun of claim 10 in which said grounding capacitive reactance includes first and second capacitances connected from one end of each secondary section to ground, the other ends of said secondary sections being the balanced balun ports.

12. The hybrid Marchand/back-wave balun of claim 1 in which said balun is a distributed balun and said coupled sections are transmission line sections.

13. The hybrid Marchand/back-wave balun of claim 1 in which said balun is a lumped balun and said coupled sections are transformer sections.

14. The hybrid Marchand/back-wave balun of claim 1 in which one of said first and second reactances is a capacitive reactance and the other is an inductive reactance and they are implemented by parasitic capacitance and parasitic inductance of the coupled sections, respectively.

15. The hybrid Marchand/back-wave balun of claim 4 in which the grounding capacitive reactance is implemented by the parasitic capacitance of coupled sections.

16. The hybrid Marchand/back-wave balun of claim 6 in which the grounding inductive reactance is implemented by the parasitic inductance of the coupled sections.

17. A hybrid Marchand/back-wave balun comprising:
a first pair of coupled sections having a first primary section and first secondary section;
a second pair of coupled sections having a second primary section and second secondary section;

a first inductive reactance interconnecting to an IF port of said first and second secondary sections and a second inductive reactance interconnecting said first and second primary sections;

said first and second inductive reactances being open at high frequency and shorted at low frequency, for selectively providing low frequency Marchand function and high frequency back-wave function and an accessible IF port.

18. The hybrid Marchand/back-wave balun of claim 17 further including a first grounding capacitive reactance connected between said first inductive reactance of the first and second secondary sections and ground.

19. The hybrid Marchand/back-wave balun of claim 18 in which said first grounding capacitive reactance includes first and second capacitances connected from ground to the IF port and the end of said first inductive reactance of the first and second secondary sections.

20. The hybrid Marchand/back-wave balun of claim 19 further including a second capacitive reactance connected from said first and second primary sections to ground.

21. The hybrid Marchand/back-wave balun of claim 20 in which said second grounding capacitive reactance includes first and second capacitances connected from each end of said second inductive reactance to ground and a third capacitance connected from said the free end of said second primary section to ground.

22. A double balanced mixer with hybrid Marchand/back-wave baluns comprising:

a first hybrid Marchand/back-wave balun for receiving a first single input and providing a first balanced output;

a second hybrid Marchand/back-wave balun for receiving a second single input and providing a second balanced output; and a balanced mixer core responsive to said first and second balanced outputs to provide a mixed signal from said first and second single inputs;

each of said hybrid Marchand/back-wave balun including a first pair of coupled sections having a first primary section and first secondary section;

a second pair of coupled sections having a second primary section and second secondary section;

a first reactance interconnecting said first and second primary sections and a second reactance interconnecting said first and second secondary sections;

one of said reactances being open at high frequency and shorted at low frequency, the other reactance being shorted at high frequency and open at low frequency for selectively providing low frequency Marchand/high frequency back-wave function and high frequency Marchand/low frequency back-wave function.

23. The double balanced mixer with hybrid Marchand/back-wave baluns of claim 22 further including an impedance transforming network interconnected between said balun mixer core and said balanced outputs of each of said hybrid baluns.

24. The double balanced mixer with hybrid Marchand/back-wave baluns of claim 22 in which said first reactance is an inductive reactance, said second reactance is a capacitive reactance and said balun functions as a Marchand balun at low frequency and a back-wave balun at high frequency.

25. The double balanced mixer with hybrid Marchand/back-wave baluns of claim 22 in which said first reactance is a capacitive reactance, said second reactance is an inductive reactance and said balun functions as a Marchand balun at high frequency and a back-wave balun at low frequency.

26. The double balanced mixer with hybrid Marchand/back-wave baluns of claim 22 in which one of the first and second reactances are capacitive reactances and the other is an inductive reactances and they are implemented by parasitic capacitance and parasitic inductance of the coupled sections, respectively.

* * * * *

UNITED STATES PATENT AND TRADEMARK OFFICE
CERTIFICATE OF CORRECTION

| | |
|---|---|
| PATENT NO. | : 7,880,557 B2 |
| APPLICATION NO. | : 12/381465 |
| DATED | : February 1, 2011 |
| INVENTOR(S) | : Xin Jiang |

It is certified that error appears in the above-identified patent and that said Letters Patent is hereby corrected as shown below:

In the drawings, Figs. 18 and 19, the direction of diodes DIODE3 and DIODE4 should be reversed.

The word "balun" in col. 12, line 18, should be changed to --balanced--.

Signed and Sealed this
Tenth Day of April, 2012

David J. Kappos
*Director of the United States Patent and Trademark Office*